United States Patent [19]

Nakano et al.

[11] Patent Number: 5,300,321

[45] Date of Patent: Apr. 5, 1994

[54] PROCESS FOR DEPOSITING TITANIUM NITRIDE FILM BY CVD

[75] Inventors: Tadashi Nakano; Tomohiro Ohta, both of Chiba, Japan

[73] Assignee: Kawasaki Steel Corporation, Hyogo, Japan

[21] Appl. No.: 56,768

[22] Filed: May 4, 1993

[30] Foreign Application Priority Data

May 12, 1992 [JP] Japan .................................. 4-118705

[51] Int. Cl.$^5$ .............................................. C23C 16/00
[52] U.S. Cl. ............................... 427/248.1; 427/255.1; 427/126.1; 427/314
[58] Field of Search ................... 427/248.1, 255.1, 314, 427/126.1

[56] References Cited

U.S. PATENT DOCUMENTS

| | | | |
|---|---|---|---|
| 5,080,927 | 1/1992 | Ikeda et al. | 427/126.1 |
| 5,178,911 | 1/1993 | Gordon et al. | 427/255.2 |
| 5,194,642 | 3/1993 | Winter et al. | 556/51 |

FOREIGN PATENT DOCUMENTS

4120344A1  1/1992  Fed. Rep. of Germany .

| | | |
|---|---|---|
| 57-429750 | 3/1982 | Japan . |
| 60-245233 | 12/1985 | Japan . |
| 3-39474 | 2/1991 | Japan . |
| 3-64473 | 3/1991 | Japan . |

*Primary Examiner*—Roy V. King
*Attorney, Agent, or Firm*—Oliff & Berridge

[57] ABSTRACT

A process which is capable of depositing a titanium nitride film of a high quality at a high deposition rate by low temperature chemical vapor deposition is provided. The titanium nitride film is deposited using a gas source comprising a compound of the general formula:

$$A_n B_m Ti$$

wherein n and m are independently selected from integers of from 1 to 3 provided that sum of n and m is equal to or smaller than 4; A is selected from a cyclic hydrocarbon group and a nitrogen-containing heterocyclic group which is bonded to the titanium by $\pi$ electron; and B is an alkylamine derivative group containing a nitrogen atom which is directly bonded to the titanium. The film deposition process of the invention is highly useful in LSI fabrication.

3 Claims, No Drawings

PROCESS FOR DEPOSITING TITANIUM NITRIDE FILM BY CVD

BACKGROUND OF THE INVENTION

This invention relates to a process for depositing a titanium nitride film which is widely used in LSI production as a barrier metal layer in a contact hole and an embedded plug, for improving migration resistance of a multilayered aluminum interconnection, and as a film for an anti-reflection coating.

In the production of LSIs, aluminum and tungsten are employed in metal interconnection for an interlayer electric contact through contact holes and via holes. Direct contact of the aluminum or the tungsten with the silicon wafer, however, may induce alloying or silicidation of the metal and intrusion of the resulting electroconductive substance into the silicon wafer to result in a significant increase of leakage current. Use of aluminum for the interconnection may also induce the problem of shortened life of the interconnection through stress migration and electromigration. Furthermore, since aluminum has a high UV reflectance, UV light projected onto the aluminum interconnection by a stepper is reflected on the aluminum surface to diffuse into the resist film and induce pattern defects, and in turn, a decrease in resolution. To prevent such problems, there has been proposed a deposition of a titanium nitride film over or underneath the metal interconnection to form a bi-layered or a sandwich-like tri-layered structure. The titanium nitride film has effectively suppressed metal diffusion to prevent the alloying and silicidation as well as the migration. Deposition of the titanium nitride film has also reduced the UV reflection on the aluminum surface to thereby prevent the resolution decrease. Furthermore, titanium nitride, which is highly electroconductive, would not reduce the conductance of the interconnection.

For producing a titanium nitride film, conventional processes such as deposition by reactive sputtering and nitrization of a metal titanium film have been widely used in the art. However, such conventional processes have proved ineffective under the recent pattern design rule of submicron order wherein steps on the surface have become steeper and the contact via holes have become deeper and narrower with an enlarged aspect ratio. More illustratively, the steps and the side wall of the holes could not be fully covered by physical vapor deposition techniques such as sputtering, and nowadays, chemical vapor deposition (CVD) techniques enabling higher step coverage are beginning to be used.

Japanese Patent Laid Open No. Sho. 60(1985)-245233 and Hei. 03(1991)-64473, for example, disclose an atmospheric pressure or a low pressure chemical vapor deposition of the titanium nitride film by using titanium (IV) chloride with nitrogen, hydrogen, or ammonia according to the following reactions (1) to (3).

$$2TiCl_4 + N_2 = 2TiN + 4Cl_2 \quad (1)$$

$$2TiCl_4 + N_2 + 4H_2 = 2TiN + 8HCl \quad (2)$$

$$2TiCl_4 + 2NH_3 + H_2 = 2TiN + + 8HCl \quad (3)$$

The reaction of the formula (1) requires a temperature as high as 1000° C. or even higher, and the reactions of the formulae (2) and (3) requires a temperature of 500° C. or higher.

A film deposition at such a high temperature is accompanied with the risk of deteriorated film properties due to diffusion of the doping layer of the semiconductor. Furthermore, the film deposition at such a high temperature exceeding the melting point of the aluminum could not be effected after the deposition and the patterning of the aluminum. Therefore, there is a strong demand for developing a CVD process which could be carried out at a temperature of up to 400° C.

Japanese Patent Publication No. Sho. 57(1982)-42970 and Japanese Patent Laid Open No. Hei. 03(1991)-39474 disclose use of organic titanium compounds to deposit a titanium nitride film by chemical vapor deposition at a temperature of up to 400° C. The organic titanium compounds disclosed therein such as tetrakis(trimethylamino)titanium and titanium dicyclopentadienyldiazide, however, are unstable and have a low vapor pressure, and therefore, use of such gas sources for the chemical vapor deposition have been unpractical for their insufficient film deposition rate.

In view of the above-described situation, an object of the present invention is to provide a CVD process at atmospheric pressure or a low pressure which is capable of depositing a high quality titanium nitride film at a low temperature and at a high deposition rate.

The inventors of the present invention have made an intensive study to solve the above-described problems, and completed the present invention after finding out that some organic chemical compounds of particular chemical compositions, which are stable and which have a high vapor pressure, may be used as a gas source for the low-temperature chemical vapor deposition to form a titanium nitride film of a high quality at a high deposition rate.

SUMMARY OF THE INVENTION

According to the present invention, there is provided a process for depositing a TiN film by chemical vapor deposition using a gas source, wherein the gas source comprises a compound of the general formula:

$$A_nB_mTi$$

wherein n and m are independently selected from integers of from 1 to 3, inclusive provided that sum of n and m is equal to or smaller than 4; A is selected from a cyclic hydrocarbon group and a nitrogen-containing heterocyclic group which is bonded to the titanium by $\pi$ electron; and B is an alkylamine derivative group containing a nitrogen atom which is directly bonded to the titanium.

DETAILED DESCRIPTION OF THE INVENTION

In the present invention, a titanium nitride film is produced by chemical vapor deposition using a gas source comprising a compound of the general formula:

$$A_nB_mTi$$

wherein n and m are independently selected from integers of from 1 to 3, inclusive provided that sum of n and m is equal to or smaller than 4; A is selected from a cyclic hydrocarbon group and a nitrogen-containing heterocyclic group which is bonded to the titanium by $\pi$ electron; and B is an alkylamine derivative group containing a nitrogen atom which is directly bonded to the titanium.

Examples of the cyclic hydrocarbon group bonded to the titanium by $\pi$ electron, which may be used as A in the above general formula, include cyclopentadienyl, methylcyclopentadienyl, cycloheptatrienyl, cyclooctatetraenyl, and azulenyl groups. Examples of the nitrogen-containing heterocyclic group bonded to the titanium by $\pi$ electron, which may be used as A in the above general formula, include pyrrolyl, methylpyrrolyl, indolyl, and imidazolyl groups.

Examples of the alkylamine derivative group containing a nitrogen atom directly bonded to the titanium, which may be used as B in the above general formula, include dialkylamino groups, for example, dimethylamino, diethylamino, sym-dimethylhydrazyl, piperazyl, and transdimethylethylenediamino groups.

In the above general formula, n and m are independently selected from integers of from 1 to 3, inclusive. The number of substituents that may become bonded in a tetravalent organic titaniun compound is four. Therefore, when monovalent substituents are bonded to titanium, the sum of n and m would be four. However, when a multivalent substituent such as piperadyl or transdimethylethylenediamino radial is used, the sum of n and m would be less than 4. When titanium has been oxided to a tri- or divalent condition, the sum of n and m would also be less than 4.

Use of titanium compounds wherein all the substituents are the same, namely, those wherein either n or m is zero in the above general formula should be avoided in the present invention since use of such a composition would retard the film deposition. It is conceived that an organic titanium compound wherein all the substituents are the same would have a geometrically symmetrical molecular structure, and when the gas source comprises a titanium compound of such a symmetrical structure, only poor interaction with the substrate would be induced upon contact of the compound with the heated substrate to result in a reduced rate of the deposition.

Any substituents may be selected from the above-described substituents. However, a titanium compound having too many high molecular weight-substituents would have an unduly high boiling point and a relatively reduced vapor pressure at a predetermined temperature, and therefore, would be undesirable. It is preferable to select a titanium compound of a low molecular weight, whose substituents comprise up to 8 carbon atoms.

Exemplary titanium compounds having such a structure, which can be suitably used in the present invention, include:

$(C_4H_4N)_2(N(CH_3)_2)_2Ti$ dipyrrolylbis(dimethylamino)titanium;

$(C_4H_4N)_2(N(C_2H_5)_2)_2Ti$ dipyrrolylbis(diethylamino)titanium;

$(C_4H_3(CH_3)N)_3N(CH_3)_2Ti$ tris(2-methylpyrrolyl)(dimethylamino)titanium;

$(C_5H_5)_2(N(CH_3)_2)_2Ti$ dicyclopentadienylbis(dimethylamino)titanium;

$(C_5H_5)_2(N(C_2H_5)_2)_2Ti$ dicyclopentadienylbis(diethylamino)titanium;

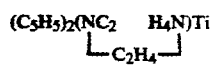

dicyclopentadienyl-N,N'-piperadyltitanium;

$(C_7H_6)\{NHN(CH_3)_2\}_3Ti$ cycloheptatrienyltris(N,N-dimethylhydradyl) titanium;

$(CH_3 \cdot C_5H_4)_2\{N(CH_3)_2\}_2Ti$ bis(methylcyclopentadienyl)bis(dimethylamino) titanium; and $(C_5H_5)_2\{N(CH_3)\cdot C_2H_4\cdot N(CH_3)\}Ti$ dicyclopentadienyl-N,N'-dimethylethylenediamino titanium.

In using the above-mentioned organic titanium compounds as a gas source for depositing a titanium nitride film by chemical vapor deposition, the organic titanium compound is vaporized by bubbling or by passing through a constant temperature cell before the vaporized compound is introduced into the reaction chamber. The gas which may be used for the bubbling and carrying of the vaporized compound is nitrogen or a gas containing nitrogen in its composition, and is not limited to any particular species. Preferred gases include, for example, nitrogen, ammonia, hydrazine, and dimethylhydrazine. Such gases as hydrogen, argon, helium, and the like may be mixed with the carrier gas to control the concentration as well as the reactivity.

The vaporized titanium compound and the carrier gas are transferred to a substrate which has been heated to a predetermined temperature. Upon contact of the titanium compound with the heated substrate, the compound undergo thermal decomposition to deposit a titanium nitride film on the substrate. The substrate may be heated to different temperatures in accordance with the type and the flow rate of the gas source as well as other conditions. The preferable temperature, however, is in the range of from 300° C. to 400° C.

The type of the reaction chamber used for the film deposition is not limited to any particular type, and both hot wall- and cold wall-types may be used. Use of a cold wall-type reaction chamber is preferable in view of minimizing particles generated through decomposition of the vaporized gas upon contact with the reaction chamber on its side wall or in the gas phase to thereby improve the reaction efficiency of the gas source. The film deposition may be carried out either under atmospheric pressure or reduced pressure conditions.

The organic titanium compound represented by the general formula: $A_nB_mTi$ can best appeal its advantageous nature when employed in low temperature thermal CVD carried out either at atmospheric pressure or at a reduced pressure. The organic titanium compounds of the above general formula are free from chlorine which is hazardous to metal interconnections and which may also cause particles, and therefore, may also be utilized as a gas source in plasma-assisted CVD and photo-assisted CVD to deposit a titanium nitride film of a quality higher than those fabricated by conventional methods.

It is estimated that a high-quality titanium nitride film can be deposited at such a high deposition rate, and at such a relatively low temperature when the above-described gas source is used for the chemical vapor deposition because (1) the compound used for the gas source is free from oxygen and chlorine; (2) the compound is highly stable to undergo no decomposition during its carriage; (3) the compound undergoes a rapid decomposition upon contact with the heated substrate to deposit the film; and (4) the compound has a high vapor pressure.

The above-mentioned reason (1) may be obvious from the molecular structure of the compound as represented by the general formula: $A_nB_mTi$. When oxygen or chlorine is contained in the chemical composition of an organic titanium compound, the compound is less likely to undergo thermal decomposition since energy of the chemical bond between such element and the titanium is extremely high. Particularly in the case when oxygen is included in the compound, the bond between the oxygen and the titanium, which is stronger than the bond between the nitrogen and the titanium, would lead to a deposition of a titanium nitride film wherein oxygen has remained within its composition, and in some extreme cases, the deposited film may comprise titanium oxide.

The above-mentioned reason (2) may be ascribed to stabilization of the compound molecule by the bond between the titanium and the $\pi$ electron which has a high electron density as well as a high electron releasability.

The above-mentioned reason (3) may be ascribed to asymmetricity of the molecular structure which advantageously acts upon catalytic reaction in the absorption and desorption on the substrate surface.

The above-mentioned reason (4) may be ascribed to the absence of hydrogen bond and high steric hindrance, which in turn lead to small intermolecular force.

The present invention is described in further detail by referring to the following Examples of the invention and Comparative Example, which by no means limit the scope of the present invention.

EXAMPLES

Examples

A titanium nitride film was deposited by low pressure chemical vapor deposition using a gas source of the organic titanium compounds shown in Table 1. The reaction chamber used was of a cylindrical, cold wall-type having a diameter of 200 mm and a height of 120 mm, which was cooled with water from its exterior. A 3-inch silicon wafer which had undergone a cleaning with 1% HF for 1 min. and a subsequent drying was used for the substrate.

High purity-nitrogen gas was bubbled at a rate of 40 ml/min. into the organic titanium compound which had been heated to 40° C., and the resulting vaporized compound was introduced into the reaction chamber together with the carrier gas. In the chamber, they were transferred to the very vicinity of the substrate through a radiant heat-reflecting mesh plate. Temperature of the substrate was adjusted to 380±1.5° C. by heating a susceptor with a heater.

In all cases, the deposited film strongly adhered to the substrate, and no defect or peeling off of the film was found upon visual inspection. The film had a specific resistance of less than 100 $\mu\Omega$-cm in all cases. Film deposition rate and chemical composition of the resulting films are shown in Table 1.

TABLE 1

| Gas source | Film deposition rate, $\mu$m/min | Chemical composition of the resulting film |
|---|---|---|
| dicyclopentadienylbis (dimethylamino)titanium | 0.5 | $Ti_{1.07}N_{0.93}$ H, < 1%; Cl, approx. 0% |
| dipyrrolylbis(diethyl amino)titanium | 0.9 | $Ti_{1.05}N_{0.95}$ H, < 1%; Cl, approx. 0% |
| tris(2-methylpyrrolyl) (dimethylamino)titanium | 0.7 | $Ti_{1.10}N_{0.90}$ H, < 1%; Cl, approx. 0% |
| cycloheptatrienyltris(N,N-dimethylhydradyl)titanium | 0.5 | $Ti_{1.08}N_{0.92}$ H, < 1%; Cl, approx. 0% |
| dicyclopentadienyl-N,N'-piperadyltitanium | 1.0 | $Ti_{1.05}N_{0.95}$ H, < 1%; Cl, approx. 0% |

Comparative Example

The procedure of the Examples was repeated by using the same reaction apparatus except that the gas source used comprised titanium chloride and ammonia. No film deposition was observed at a substrate temperature of 380° C. Upon film deposition at a substrate temperature raised to 500° C., a titanium nitride film could be deposited but at a deposition rate of as low as 0.05 $\mu$m/min. In addition, the resulting film was of a low quality having a ratio of Ti:N of 1.2:0.8 including 5% by mole of hydrogen and 4% by mole of chloride. Also, the film had a specific resistance higher than 500 $\mu\Omega$-cm, and peeling off of the film from the substrate was observed in some parts.

The results indicate that a high quality titanium nitride film substantially free from impurities having a Ti:N ratio in the vicinity of 1:1 could be deposited at a quite high deposition rate and at a substrate temperature of as low as 380° C. to demonstrate the effectiveness of the process of the invention.

As described above, a titanium nitride film of a quite high quality, which may be used for such purposes as a barrier metal layer of LSI metal interconnections and antireflection film upon exposure to UV, could be deposited by the process of the present invention utilizing particular types of organic titanium compounds for the gas source of chemical vapor deposition. Such a process would be of great assistance for the future development of the industry.

We claim:

1. A process for depositing a titanium nitride film comprising subjecting a substrate to chemical vapor deposition using a gas source comprising a compound of the general formula:

$$A_nB_mTi$$

wherein n and m are independently selected from integers of from 1 to 3, inclusive, provided that sum of n and m is equal to or smaller than 4; A is a cyclic hydrocarbon group which is bonded to the titanium by $\pi$ electron and selected from the group consisting of cyclopentadienyl, alkylcyclopentadienyl, cycloheptatrienyl, cyclooctatetraenyl, and azulenyl groups; and B is an alkylamine derivative group containing one nitrogen atom which is directly bonded to the titanium.

2. The process according to claim 1 wherein B is selected from the group consisting of dimethylamino and diethylamino groups.

3. A process for depositing a titanium nitride film by comprising subjecting a substrate to chemical vapor deposition using a gas source comprising a compound of the general formula:

$$A_nB_mTi$$

wherein n and m are independently selected from integers of from 1 to 3, inclusive, provided that sum of n and m is equal to or smaller than 4; A is a cyclic hydrocarbon group or a nitrogen-containing heterocyclic group which is bonded to the titanium by $\pi$ electron and selected from the group consisting of cyclopentadienyl, cycloheptatrienyl, pyrrolyl and methylpyrrolyl groups; and B is a member selected from the group consisting of sym-dimethylhydrazyl, piperazyl and N,N'-dimethylethylenediamino groups.

* * * * *